United States Patent
Ikegami et al.

(10) Patent No.: US 10,236,062 B2
(45) Date of Patent: Mar. 19, 2019

(54) PROCESSOR

(71) Applicant: KABUSHIKI KAISHA TOSHIBA, Minato-ku, Tokyo (JP)

(72) Inventors: Kazutaka Ikegami, Kawasaki (JP); Shinobu Fujita, Inagi (JP); Keiko Abe, Yokohama (JP); Kumiko Nomura, Tokyo (JP); Hiroki Noguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 375 days.

(21) Appl. No.: 14/208,132

(22) Filed: Mar. 13, 2014

(65) Prior Publication Data
US 2014/0379975 A1 Dec. 25, 2014

(30) Foreign Application Priority Data
Jun. 25, 2013 (JP) .................................. 2013-132879

(51) Int. Cl.
*G06F 12/00* (2006.01)
*G11C 14/00* (2006.01)
*G06F 1/3228* (2019.01)
*G06F 1/3287* (2019.01)
*G06F 1/3296* (2019.01)
*G06F 12/0895* (2016.01)

(52) U.S. Cl.
CPC ........ *G11C 14/0081* (2013.01); *G06F 1/3228* (2013.01); *G06F 1/3287* (2013.01); *G06F 1/3296* (2013.01); *G06F 12/0895* (2013.01); *G06F 2212/225* (2013.01); *Y02D 10/171* (2018.01); *Y02D 10/172* (2018.01)

(58) Field of Classification Search
None
See application file for complete search history.

(56) References Cited

U.S. PATENT DOCUMENTS

| 5,519,831 | A | * | 5/1996 | Holzhammer ...... G06F 11/1441 365/228 |
| 2008/0080261 | A1 | | 4/2008 | Shaeffer et al. |
| 2011/0219190 | A1 | * | 9/2011 | Ng ...................... G06F 12/0862 711/122 |
| 2011/0228614 | A1 | * | 9/2011 | Shaeffer ................ G11C 5/025 365/189.04 |
| 2012/0233377 | A1 | | 9/2012 | Nomura et al. |

(Continued)

FOREIGN PATENT DOCUMENTS

| EP | 0-543-582 A1 | 5/1993 |
| JP | H05-225074 A | 9/1993 |
| JP | 2009-157775 | 7/2009 |

(Continued)

*Primary Examiner* — Baboucarr Faal
(74) *Attorney, Agent, or Firm* — Finnegan, Henderson, Farabow, Garrett & Dunner, L.L.P.

(57) ABSTRACT

According to one embodiment, a processor includes a core controlling processing data, a cache data area storing the processing data as cache data in a nonvolatile manner, a first tag area storing a tag data of the cache data in a volatile manner, a second tag area storing the tag data in a nonvolatile manner, a tag controller controlling the tag data. The tag controller determines whether the processing data is stored in the cache data area by acquiring the tag data from one of the first and second tag areas.

13 Claims, 19 Drawing Sheets

(56) References Cited

U.S. PATENT DOCUMENTS

2013/0080812 A1    3/2013  Shirota et al.

FOREIGN PATENT DOCUMENTS

| | | |
|---|---|---|
| JP | 2010-524089 A | 7/2010 |
| JP | 2010-250511 | 11/2010 |
| JP | 2012-190359 A | 10/2012 |
| JP | 2013-69099 A | 4/2013 |
| JP | 2013-521559 A | 6/2013 |
| WO | WO 03/042837 | 5/2003 |

* cited by examiner

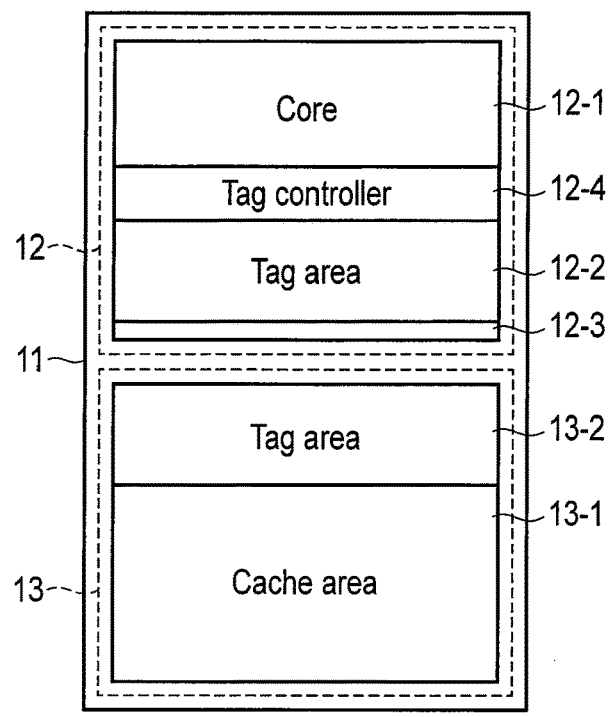
F I G. 1
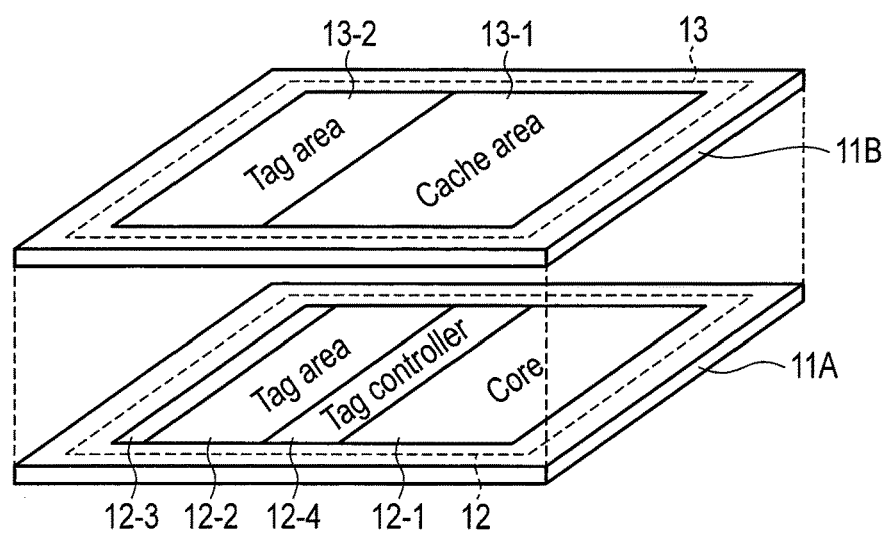
F I G. 2

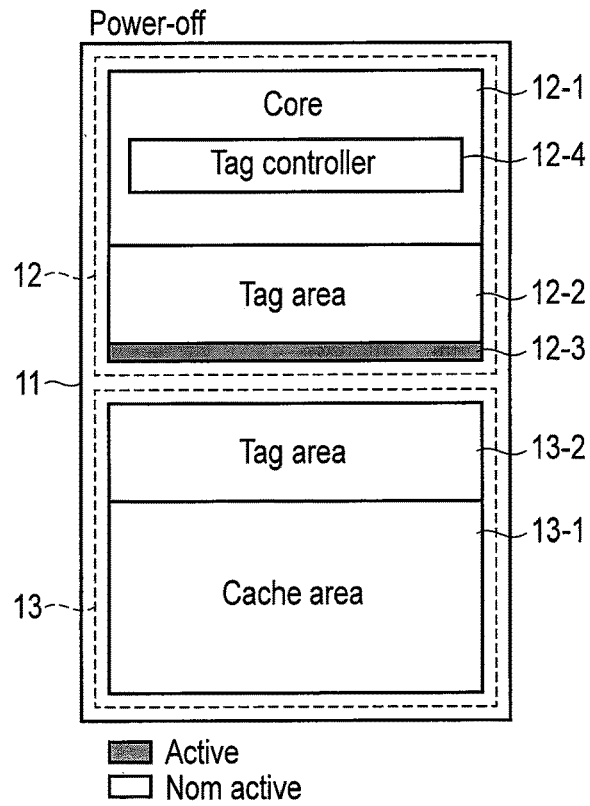
F I G. 7
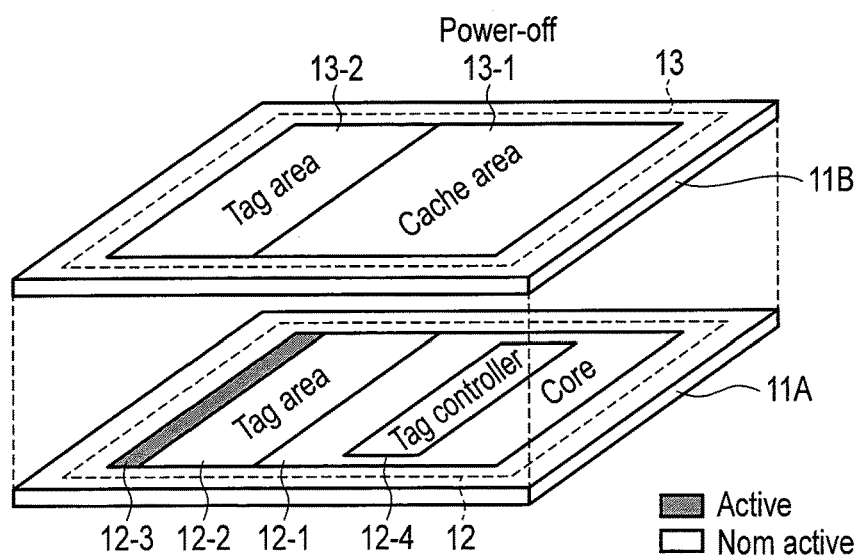
F I G. 8

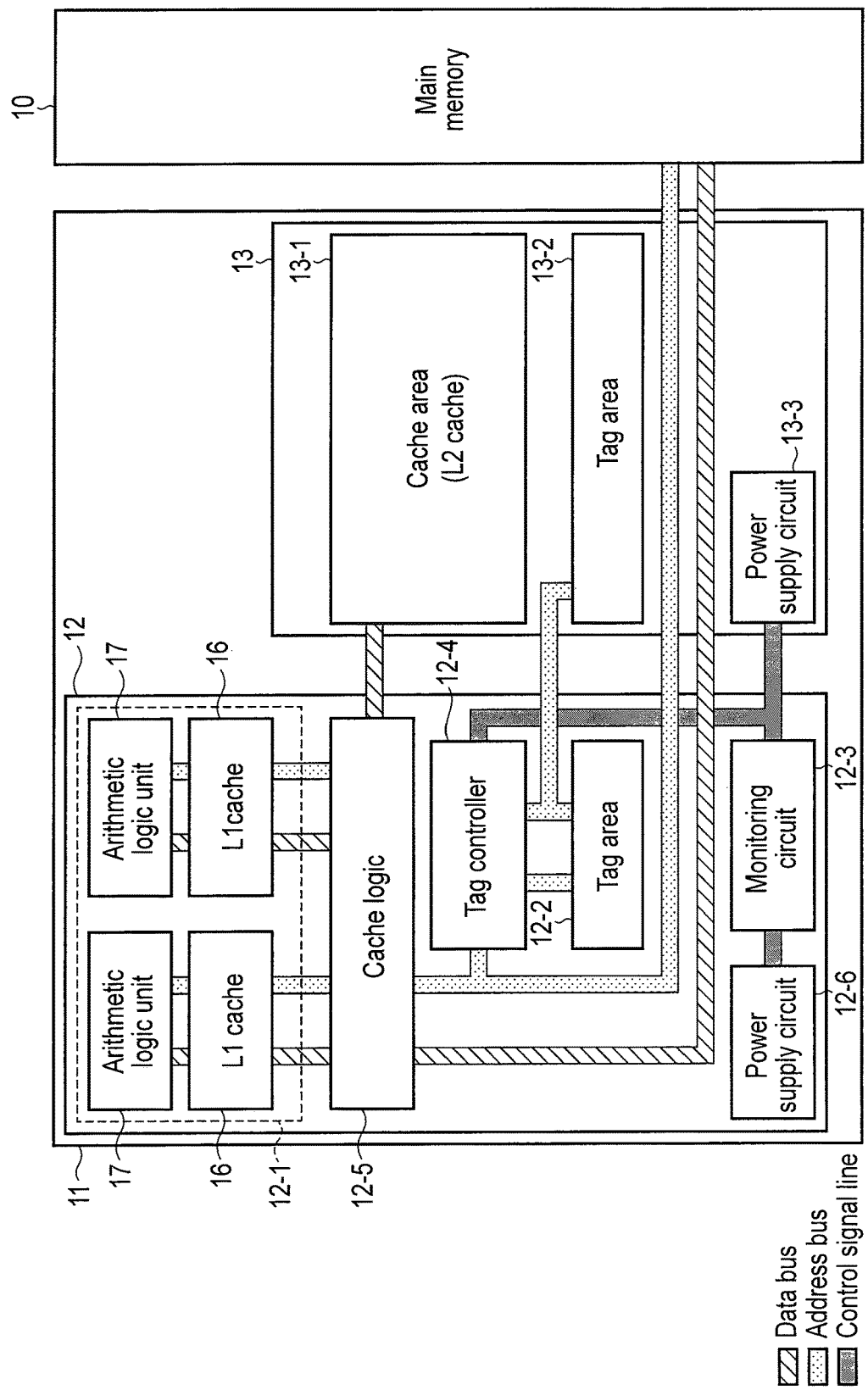
F I G. 11

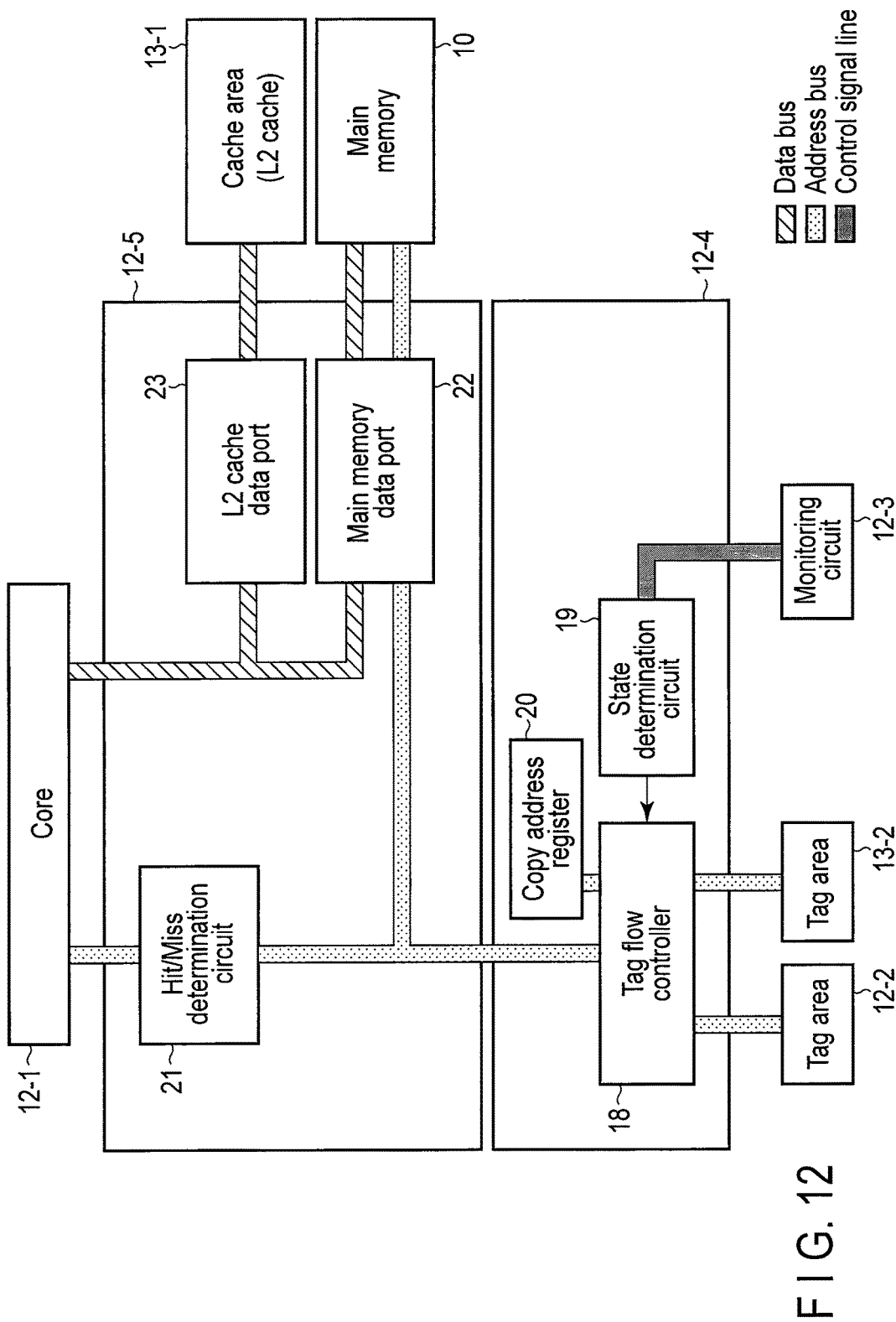
F I G. 12

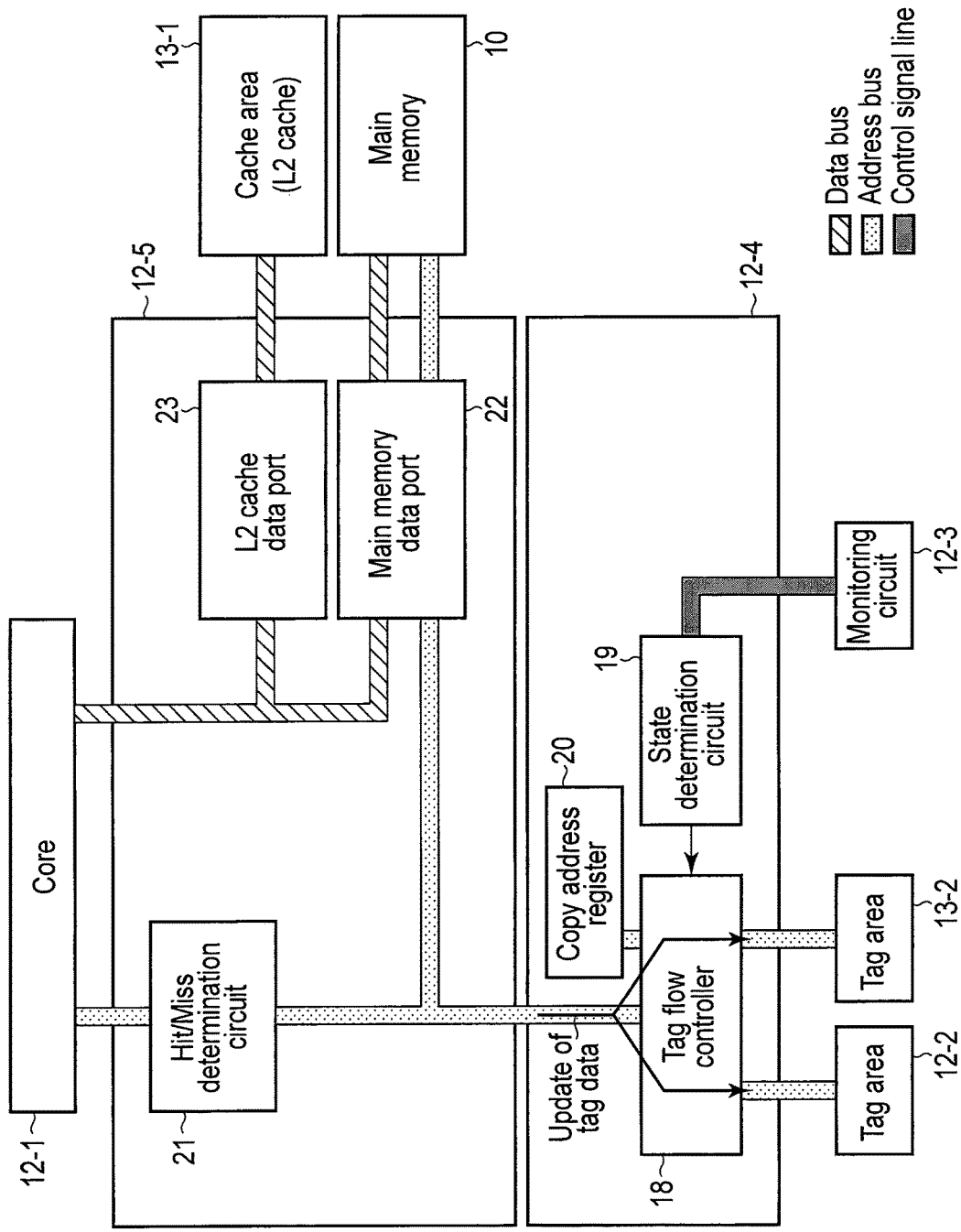
F I G. 13

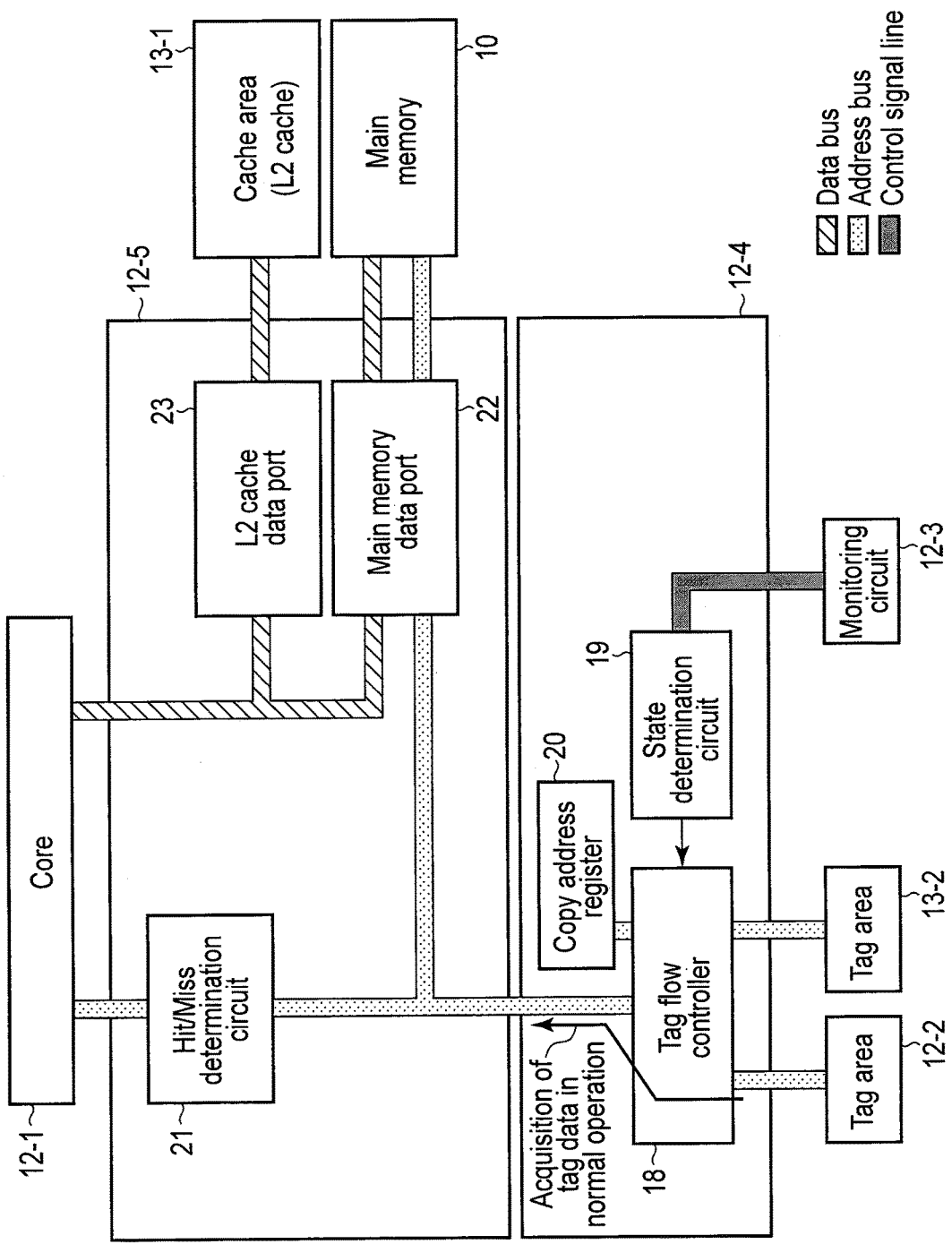
F I G. 14

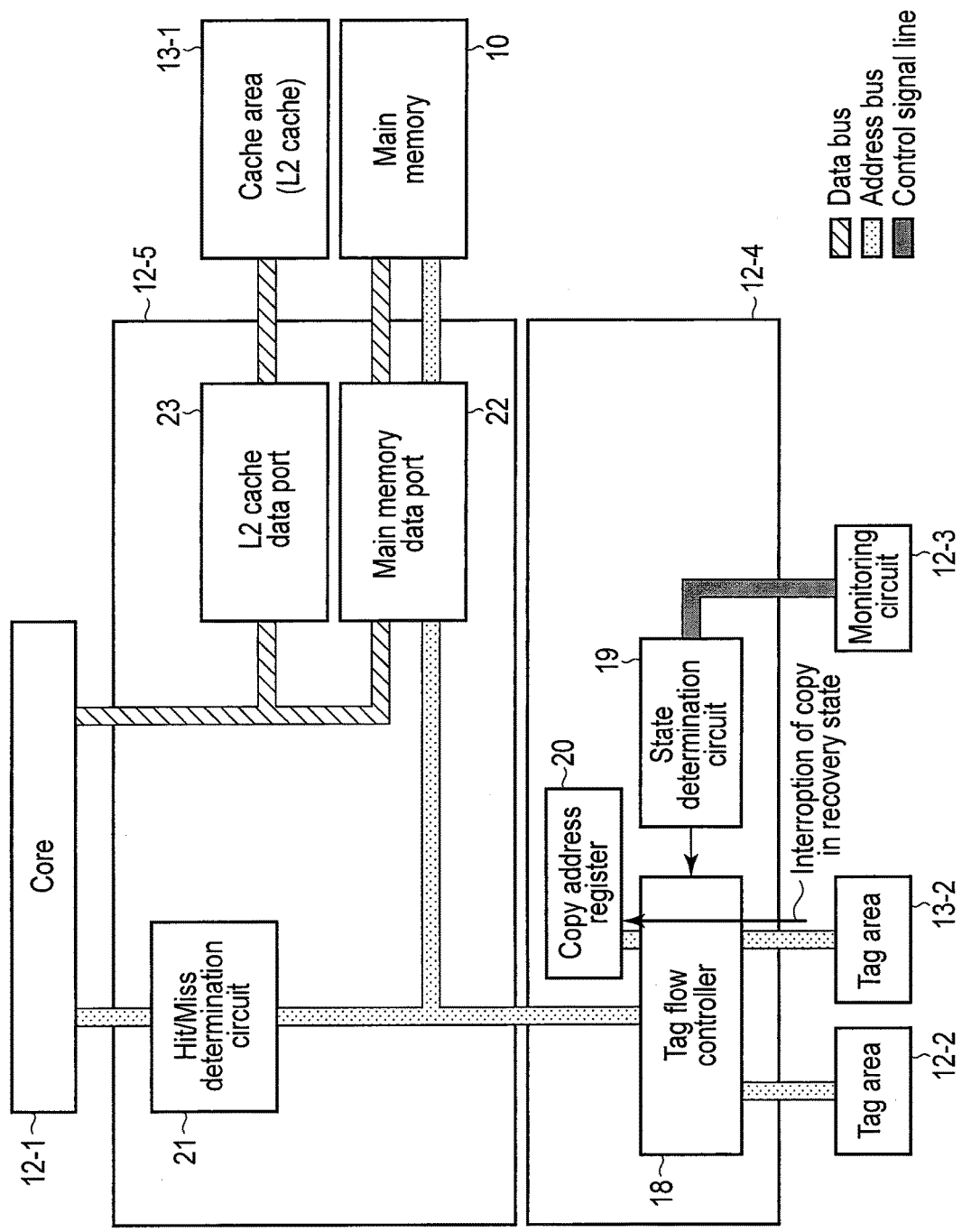
F I G. 16

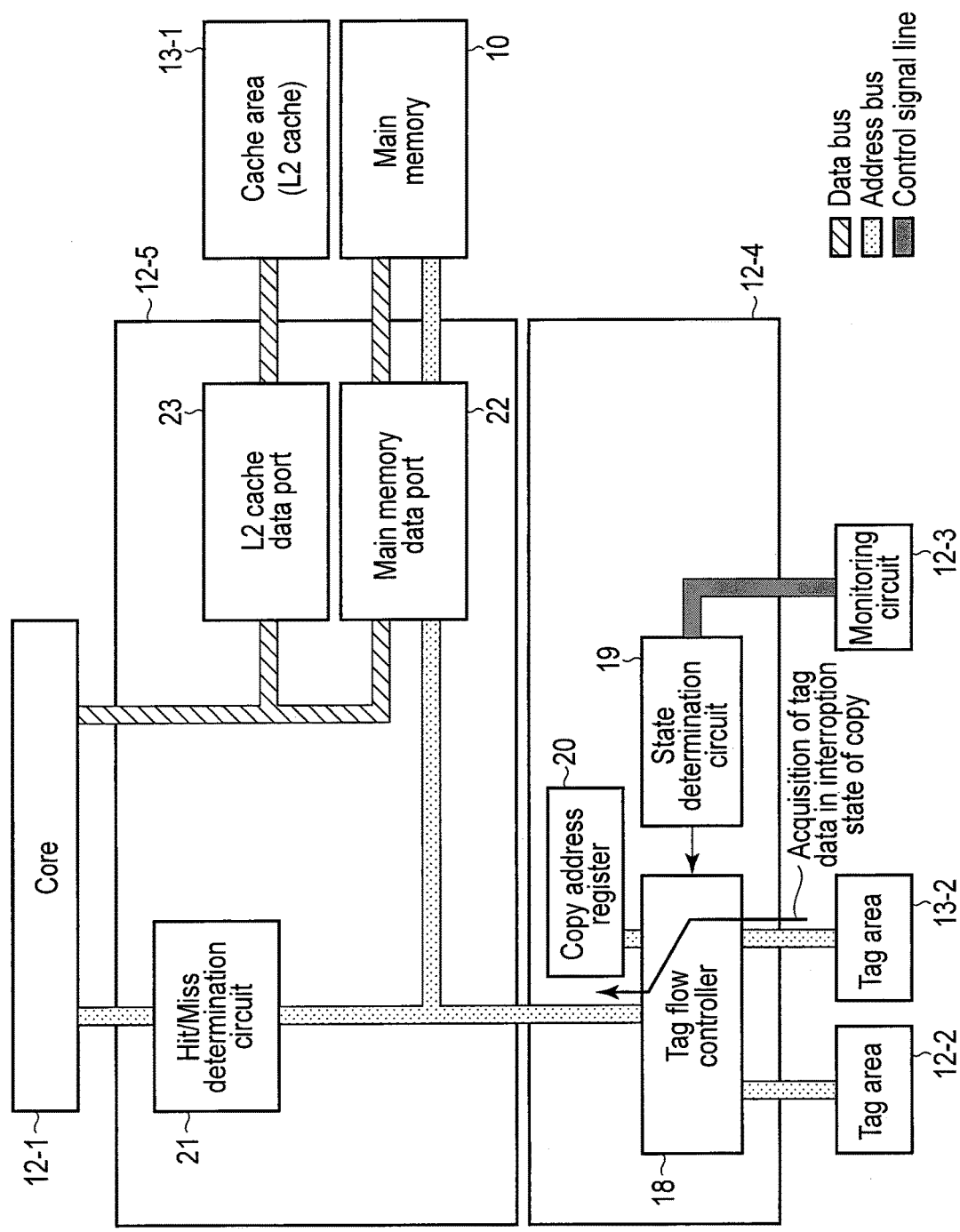
F I G. 17

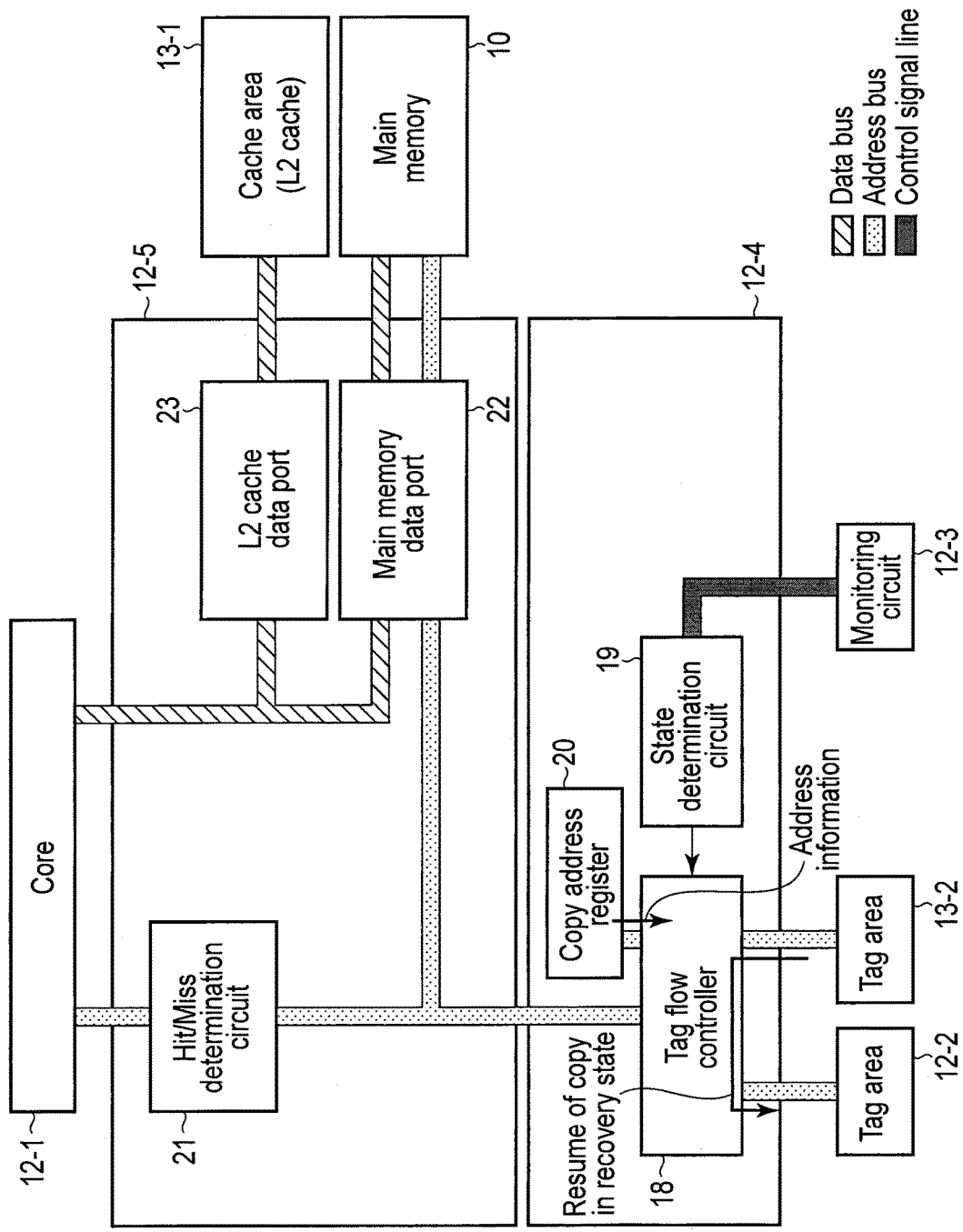
F I G. 18

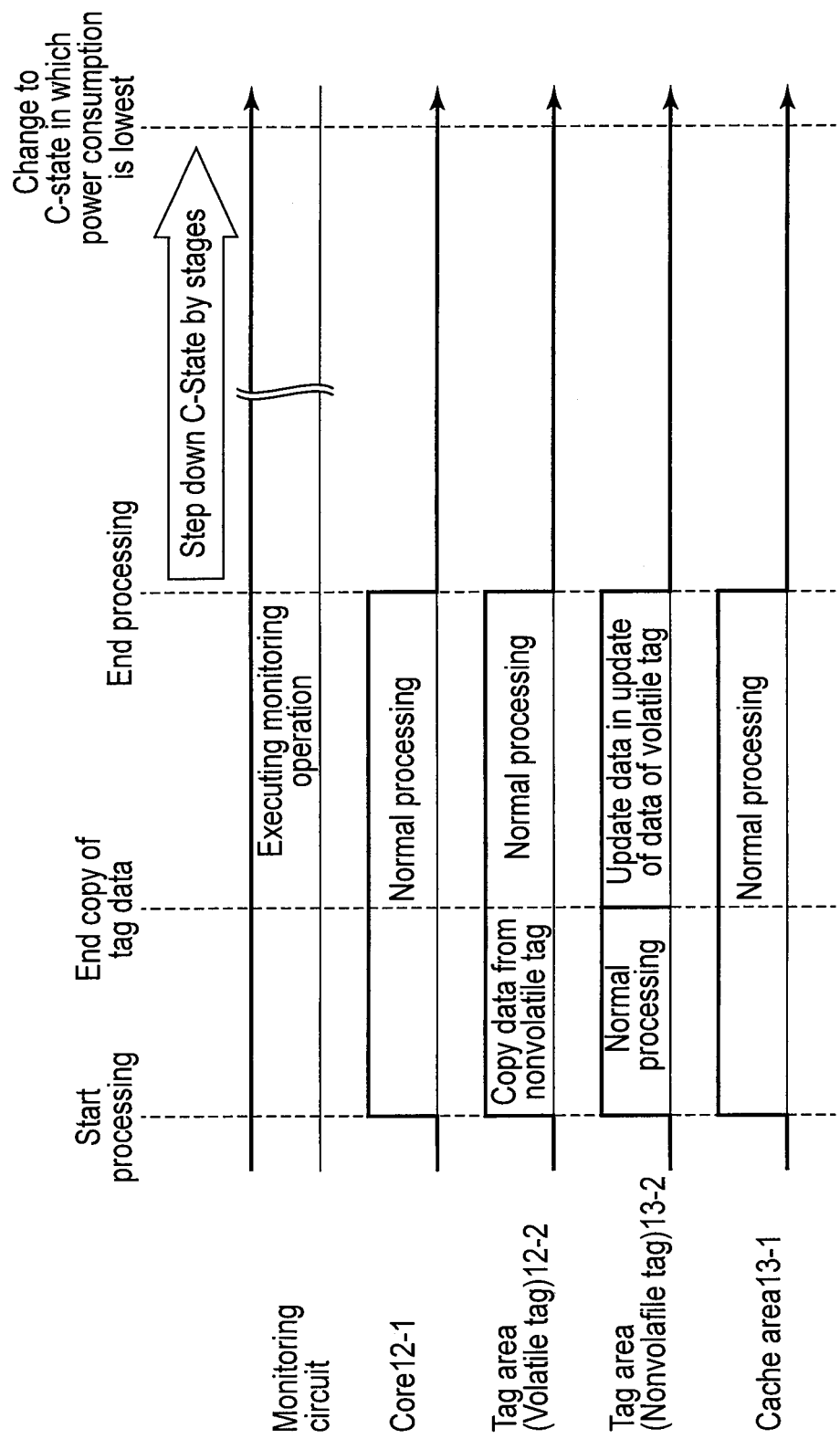
F I G. 20

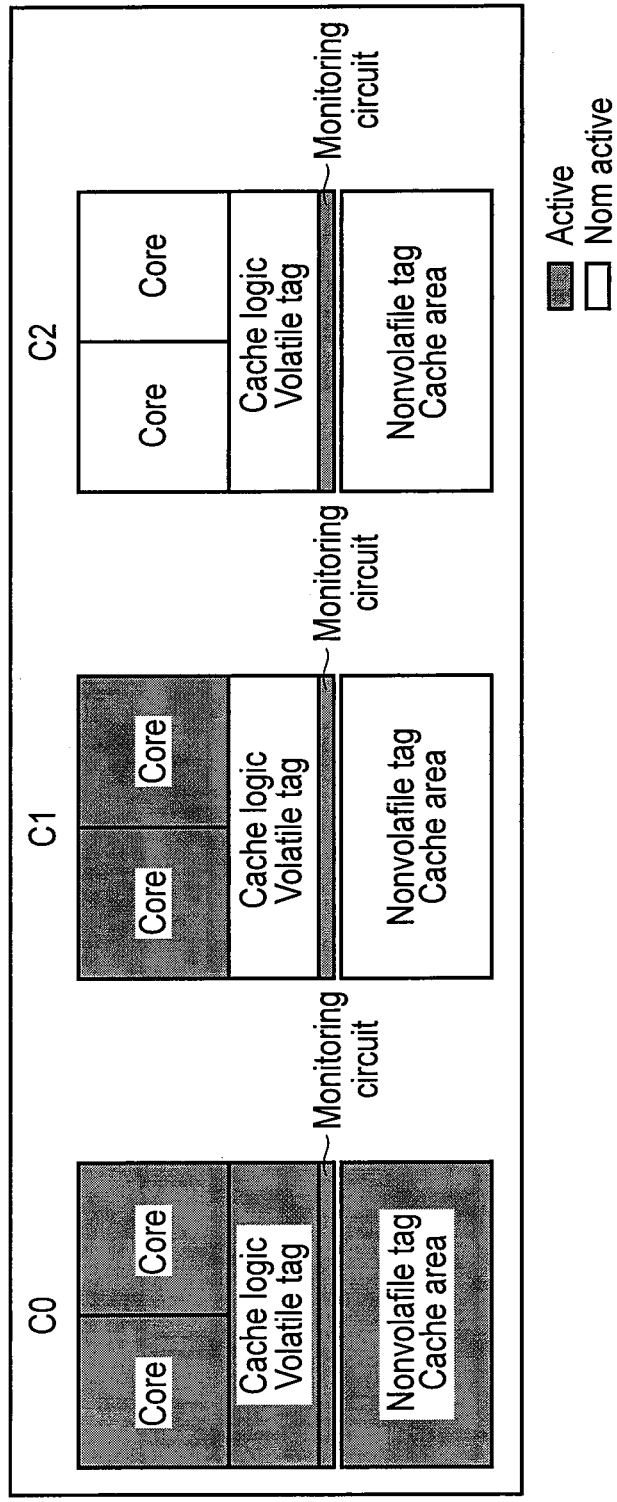
F I G. 21

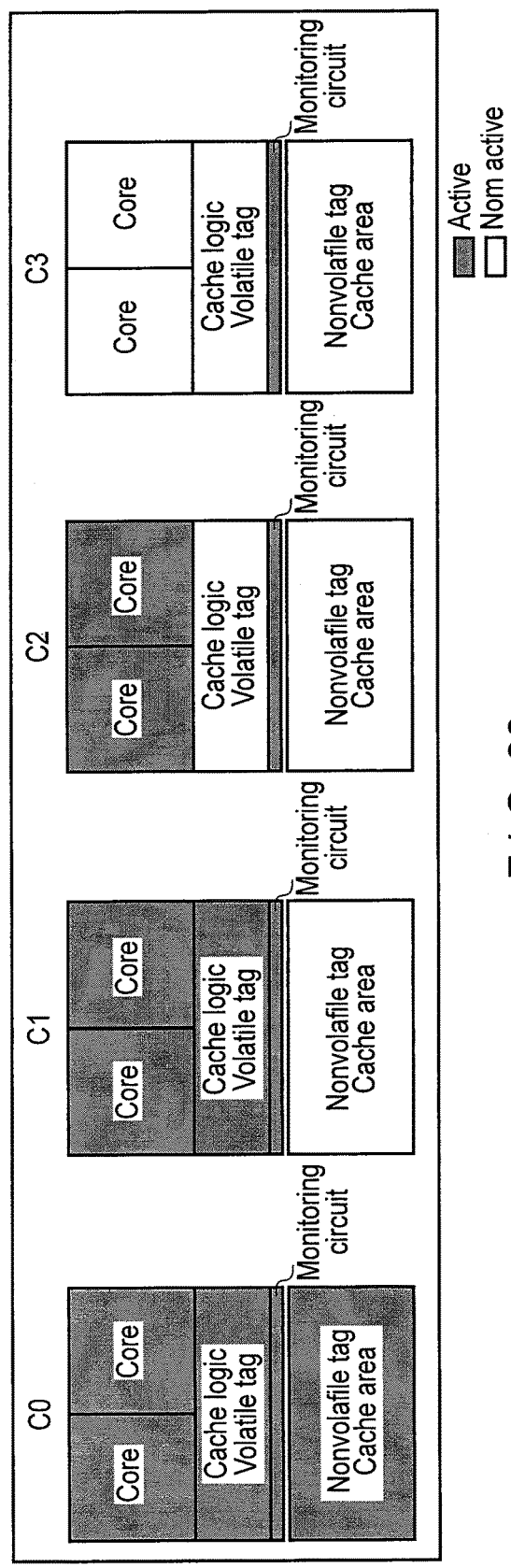
F I G. 22

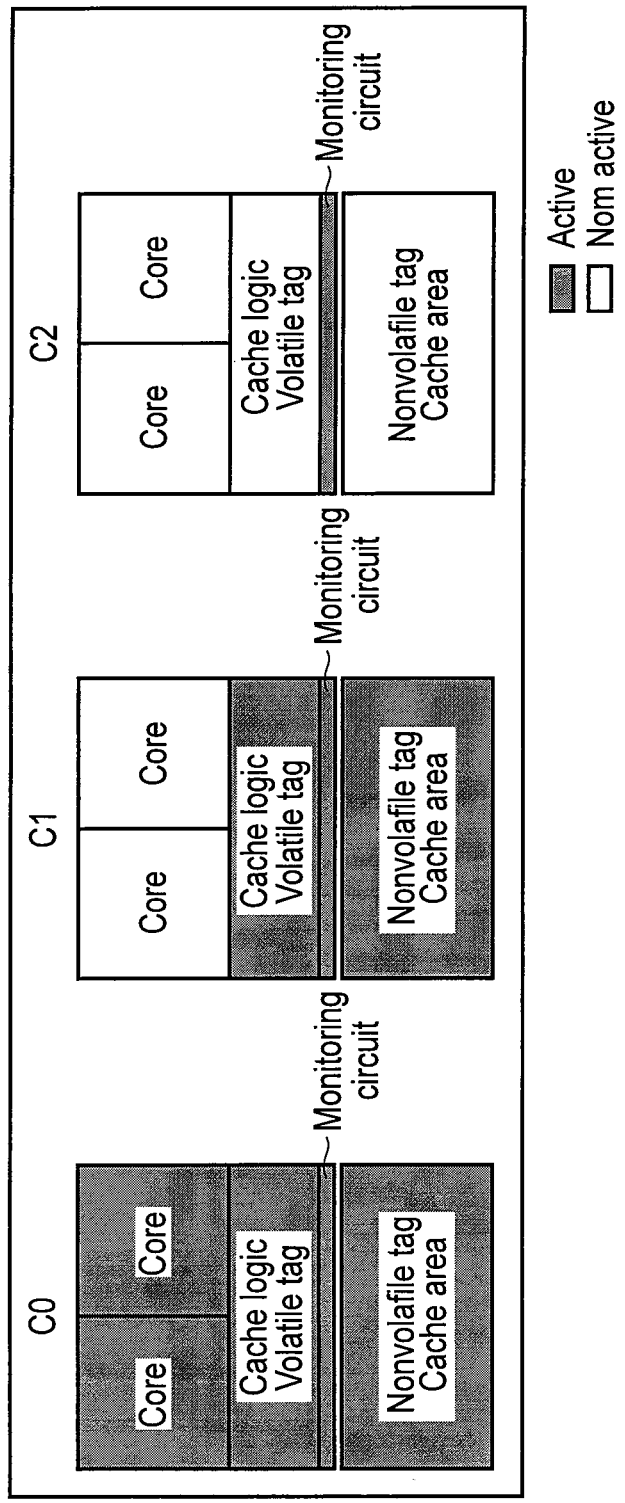
F I G. 23

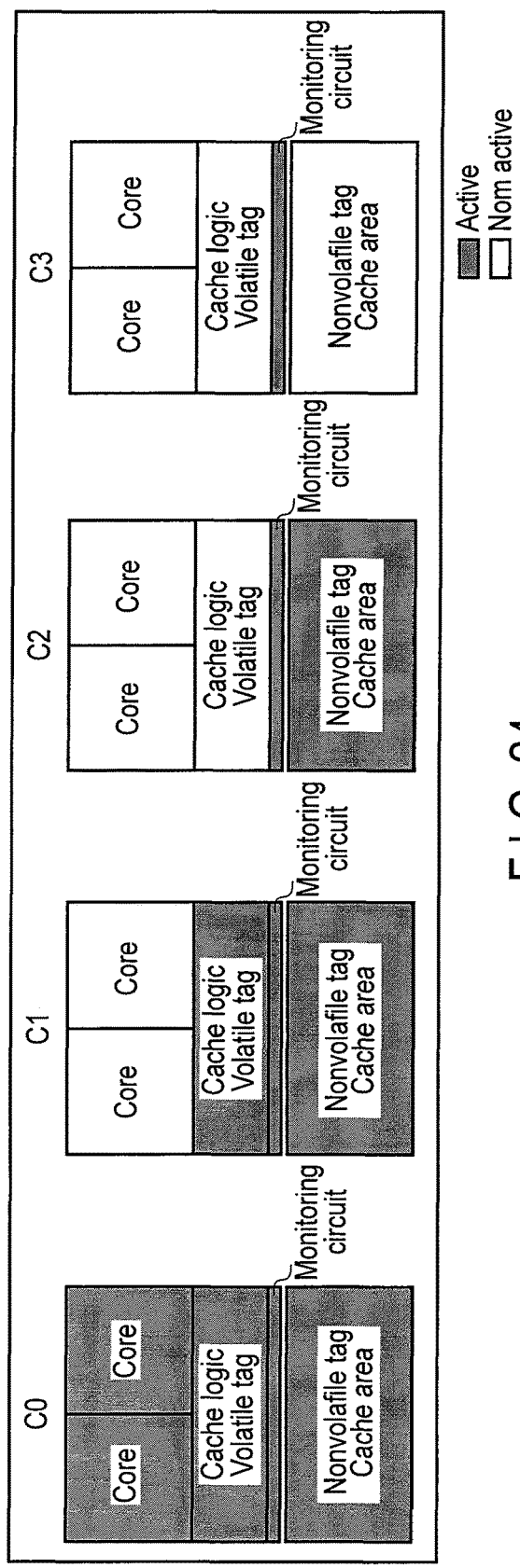
F I G. 24

PROCESSOR

CROSS-REFERENCE TO RELATED APPLICATIONS

This application is based upon and claims the benefit of priority from Japanese Patent Application No. 2013-132879, filed Jun. 25, 2013, the entire contents of which are incorporated herein by reference.

FIELD

Embodiments described herein relate generally to a processor.

BACKGROUND

A technique of enhancing processor performance by using a DRAM having a greater capacity per unit area than an SRAM as a cache memory (L2 cache) is well known. In this technique, a CMOS chip and a DRAM chip are stacked, and tag data (such as address information and history) is stored in the CMOS chip.

On the other hand, recent processors employ a technique of reducing consumption of power by turning off power when idle state has continued for a predetermined period. In this case, if the supply of power to the CMOS chip and the DRAM chip is completely turned off, cache data and tag data will be lost, and further, the time required to re-load necessary data after re-switching on the circuit will become long.

To avoid the above, a process of not turning off the supply of power to the area of the CMOS chip storing the tag data or to the DRAM chip may be employed to protect the cache data and tag data. In this case, however, consumption of power will inevitably be increased.

BRIEF DESCRIPTION OF THE DRAWINGS

FIGS. 1 and 2 show an example of a processor;
FIGS. 7 and 8 show the power-off state of the processor;
FIGS. 9 and 10 show the state of the processor after its circuit is turned on;
FIG. 11 shows a cache system;
FIG. 12 shows a tag controller and a cache controller in detail;
FIGS. 13 to 18 show operations of a tag-flow controller;
FIG. 20 shows the operations of the blocks of the cache system;
and
FIGS. 21 to 24 show examples of C-states.

DETAILED DESCRIPTION

Figure 3:
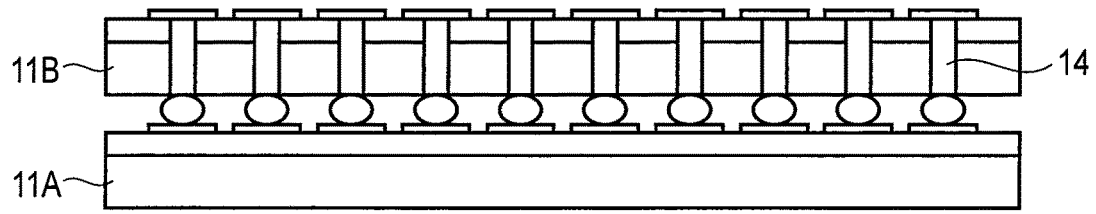
FIGS. 3 and 4 show an example of a stacked chip.

In general, according to one embodiment, a processor comprises: a core controlling processing data; a cache data area storing the processing data as cache data in a nonvolatile manner; a first tag area storing a tag data of the cache data in a volatile manner; a second tag area storing the tag data in a nonvolatile manner; a tag controller controlling the tag data. The tag controller determines whether the processing data is stored in the cache data area by acquiring the tag data from one of the first and second tag areas.

An embodiment will be described with reference to the accompanying drawings.

[Outline]

An embodiment described below relates to the cache system of a processor.

For instance, the processor comprises a CMOS circuit with a core for controlling cache data (processing data) and a tag area for storing tag data (such as address information and history) in a volatile manner, and a cache memory with a cache data area for storing cache data.

The CMOS circuit includes a logic circuit for performing operational processing, and a memory circuit storing data. The cache memory includes a memory circuit storing data.

For instance, the CMOS circuit is provided in a first chip, and a cache memory is provided in a second chip, and the first and second chips are stacked on each other. Alternatively, the CMOS circuit and the cache memory may be mounted on one chip (semiconductor substrate).

When the CMOS circuit and the cache memory are stacked on each other, this is sometimes advantageous in cost, while when they are provided on one semiconductor substrate, this is advantageous in operation speed. Which should be employed is determined considering a balance between cost and operation speed.

In the processor constructed as the above, firstly, a nonvolatile memory, such as a magnetic random access memory (MRAM), is employed as the cache memory. In this case, cache data is stored in a nonvolatile manner in a nonvolatile memory, and is therefore not lost even if supply of power to the nonvolatile memory is turned off for power saving after the processor is kept in idle state for a predetermined period.

However, the tag data of the cache data is stored in a volatile manner in a tag area within a CMOS circuit, such as an SRAM, a register or a flip-flop circuit. Accordingly, if, for example, the supply of power to the CMOS circuit is turned off for power saving after the processor is kept in idle state for a predetermined period, the tag data of the cache data will be lost.

In light of this, in the embodiment described below, a tag area (replica) for storing the tag data of cache data in a nonvolatile manner is provided to prevent the tag data from being lost even if the power to the CMOS circuit is turned off.

Further, in accordance with the employment of the above structure, a tag controller for controlling tag data is newly provided in the CMOS circuit. The tag controller is configured to acquire tag data from the tag area in the CMOS circuit or the tag area in the nonvolatile memory.

Namely, the tag controller in the CMOS circuit determines whether cache data is stored in the cache data area in the nonvolatile memory, based on the tag data acquired from one of the two tag areas.

[During Normal Operation]

When reading tag data, the tag controller in the CMOS circuit reads tag data from the tag area in the CMOS circuit, and determines, based on the tag data, whether cache data is stored in the cache data area in the nonvolatile memory.

Thus, when reading tag data, data processing of high speed and low power consumption can be realized by reading the tag data from the tag area in the CMOS circuit.

Further, when the tag controller in the CMOS circuit updates the tag data stored in the tag area of the CMOS circuit, it also updates the tag data stored in the tag area of the nonvolatile memory. As a result, even when the power to the CMOS circuit and to the nonvolatile memory is turned off, the updated tag data can be protected.

[At Power Shutdown]

For instance, after the idle state of the processor continues for a predetermined period, the power to the core, the tag area and the tag controller in the CMOS circuit, and to the cache data area and the tag area in the nonvolatile memory is turned off. Further, after the supply of power is resumed, the tag controller in the CMOS circuit copies tag data from the nonvolatile memory to the CMOS circuit.

In conventional processors, when being recovered from the power off state, it is necessary to load both tag data and cache data. In contrast, in the embodiment, recovery is possible by transferring only tag data from the nonvolatile memory to the CMOS circuit, and therefore prolonged data load is not needed unlike the conventional processors.

Further, when tag data is read after the supply of power to the core, tag area and tag controller in the CMOS circuit, and to the cache data area and tag area in the nonvolatile memory is resumed, the tag controller in the CMOS circuit continues to acquire tag data from the tag area in the nonvolatile memory until copying of all tag data from the nonvolatile memory to the CMOS circuit is finished.

After copying all tag data from the nonvolatile memory to the CMOS circuit, the tag controller in the CMOS circuit acquires tag data from the tag area in the CMOS circuit.

Since thus, after the supply of power to the core, tag area, and tag controller in the CMOS circuit, and to the cache data area and tag area in the nonvolatile memory is resumed, smooth date processing in the processor can be realized by varying tag data acquisition operation in accordance with the advanced state of the copying.

In the embodiment below, a detailed description will be given of what circuit is used actually to perform the above operation.

[Embodiment]

FIGS. 1 and 2 show a processor associated with the embodiment.

FIG. 1 shows an example where a CMOS circuit 12 and a nonvolatile memory 13 are mounted on a single semiconductor substrate (chip) 11. FIG. 2 shows an example where a chip 11A with the CMOS circuit 12 formed thereon, and a chip 11B with the nonvolatile memory 13 formed thereon, are stacked on each other.

The nonvolatile memory 13 is, for example, an MRAM, and comprises a cache data area 13-1 and a tag area 13-2. The cache data area 13-1 functions as, for example, an L2 cache, and stores cache data in a nonvolatile manner. Further, the tag area (replica) 13-2 stores tag data included in the cache data stored in the L2 cache.

The CMOS circuit 12 comprises a core 12-1, a tag area 12-2, a monitoring circuit 12-3 and a tag controller 12-4. For instance, the power supplies for the core 12-1, the tag area 12-2, the monitoring circuit 12-3 and the tag controller 12-4 can be controlled independently.

The core 12-1 includes a computing unit, an L2 cache (e.g., an SRAM), etc. Further, the core 12-1 performs data computation. The tag area 12-2 comprises, for example, an SRAM, a register, a flip flop, etc., and stores the tag data of the cache data in the L2 cache in a volatile manner.

The monitoring circuit 12-3 monitors the power supplies for the core 12-1, tag area 12-2 and tag controller 12-4 of the CMOS circuit 12, and those for the cache data area 13-1 and tag area 13-2 of the nonvolatile memory 13.

Thus, the supply of power to the monitoring circuit 12-3 is not turned off even after the supply of power to the core 12-1, the tag areas 12-2 and 13-2, the tag controller 12-4, and the cache data area 13-1 is turned off.

The tag controller 12-4 controls reading and writing of tag data in the tag area 12-2 of the CMOS circuit 12 and in the tag area 13-2 of the nonvolatile memory 13, based on the output signal of the monitoring circuit 12-3.

The tag controller 12-4 will be described later in detail.

Figure 4:
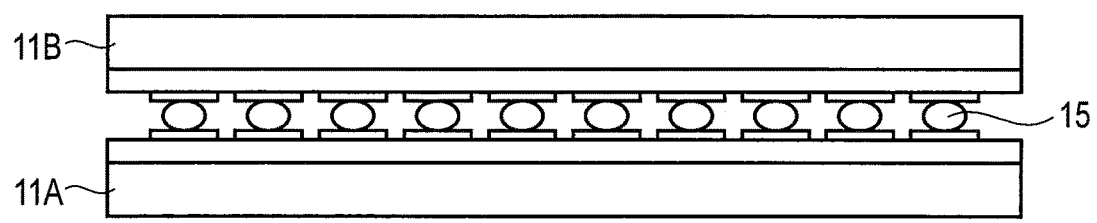

For instance, the stack of the chips 11A and 11B shown in FIG. 2 is realized using the through silicon vias (TSV) 14 shown in FIG. 3, or using the flip-chip bonding of micro bumps 15 shown in FIG. 4.

FIGS. 5 to 10 show tag data control methods corresponding to the states of the processor.

The tag data is used to determine whether the data (processing data) requested by the core 12-1 exists in the cache data area 13-1 as the L2 cache. For example, the tag controller 12-4 refers to the tag data to determine whether the data requested by the core 12-1 exists in the cache data area 13-1.

If it is determined that the data requested by the core 12-1 exists in the cache data area 13-1, this determination is called a hit determination, whereas if it is determined that the data requested by the core 12-1 does not exist in the cache data area 13-1, this determination is called a miss determination.

If the tag controller 12-4 has performed a hit determination, it acquires, from the cache data area 13-1, the data requested by the core 12-1. The core 12-1 processes this data using, for example, the computing unit.

In contrast, if the tag controller 12-4 has performed a miss determination, it acquires, from the main memory (e.g., a DRAM), the data requested by the core 12-1. The core 12-1 processes this data using, for example, the computing unit.

If the data (processing data) to be processed by the core 12-1 is acquired from the main memory, it is stored in the cache data area 13-1 as the L2 cache to thereby enhance the speed of acquiring the data in a later stage.

Further, when new data is stored in the cache data area 13-1, corresponding tag data in the tag area 12-2 of the CMOS circuit 12 and the tag data in the tag area 13-2 of the nonvolatile memory 13 are updated.

[During Normal Operation]

Figure 5:
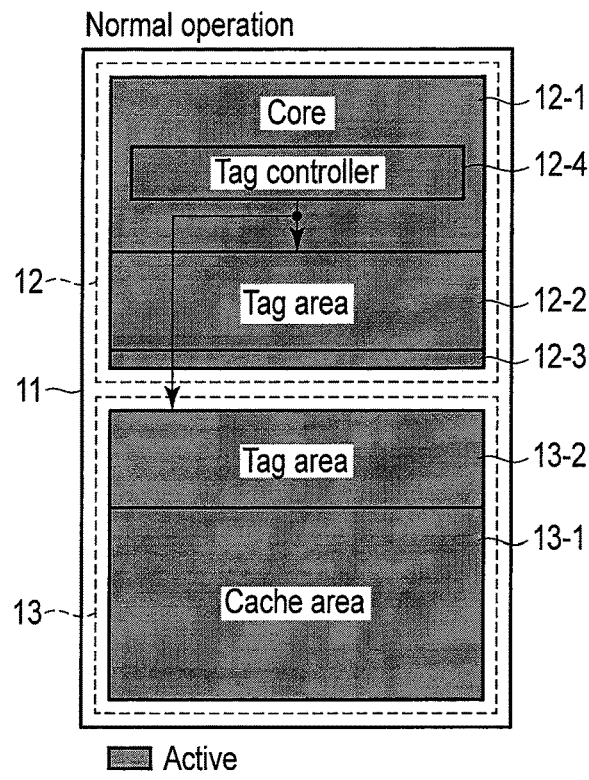
FIGS. 5 and 6 show the normal operation state of the processor.
Figure 6:
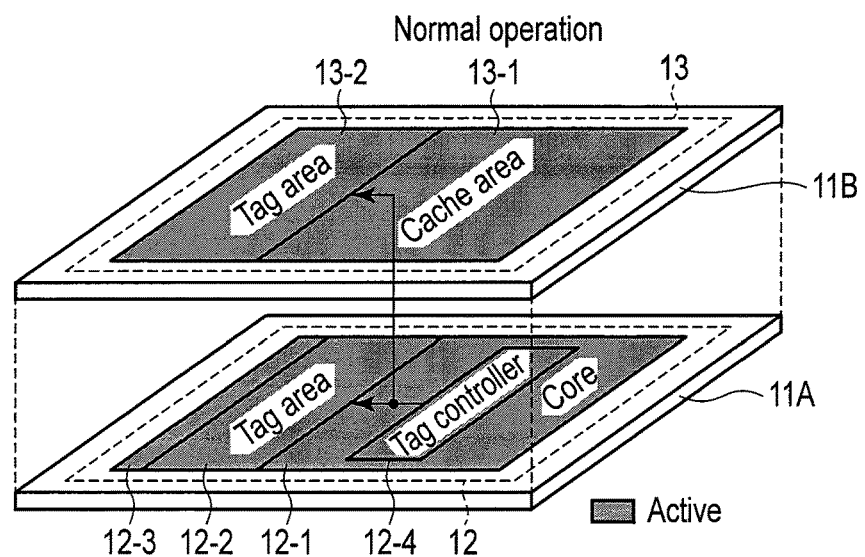

As shown in FIGS. 5 and 6, the core 12-1, tag area 12-2, monitoring circuit 12-3 and tag controller 12-4 of the CMOS circuit 12 are in the powered state, i.e., in the active state. Further, the cache data area 13-1 and tag area 13-2 of the nonvolatile memory 13 are also in the active state.

When reading tag data, the tag controller 12-4 of the CMOS circuit 12 reads the tag data from the tag area 12-2 of the CMOS circuit 12. Further, based on the tag data, the tag controller 12-4 determines whether the required data is stored in the cache data area 13-1 of the nonvolatile memory 13.

When updating the tag data in the tag area 12-2 of the CMOS circuit 12, the tag controller 12-4 of the CMOS circuit 12 also updates the tag data in the tag area 13-2 of the nonvolatile memory 13. Namely, the tag data in the two tag areas 12-2 and 13-2 is controlled to have the same value.

[At Power Off State]

As shown in FIGS. 7 and 8, when, for example, the processor is kept in the idle state for a predetermined period, the power to the core 12-1, tag area 12-2 and tag controller 12-4 of the CMOS circuit 12, and the power to the cache data area 13-1 and tag area 13-2 of the nonvolatile memory 13, are turned off for power saving.

The power-off state will be hereinafter referred to as a non-active state.

To monitor resuming of power supply, the monitoring circuit 12-3 of the CMOS circuit 12 is kept in a power-supplied state, i.e., in the active state.

Figure 9:
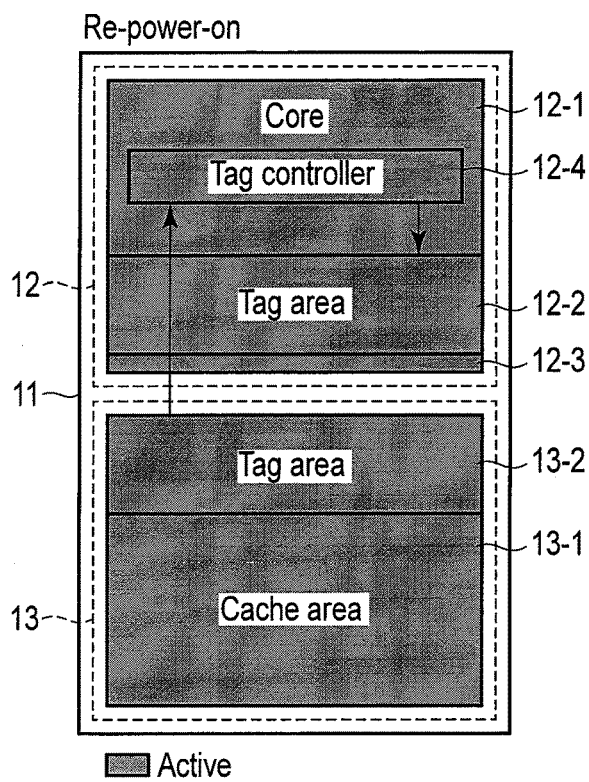
Figure 10:
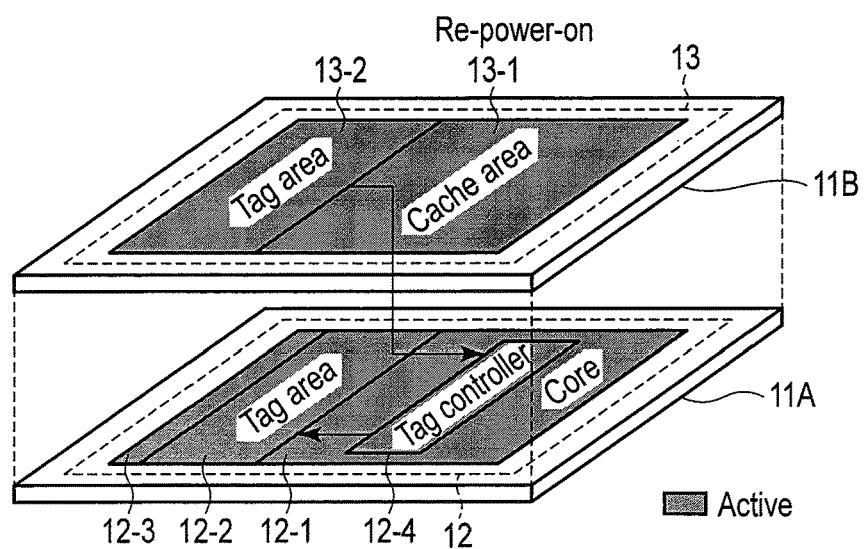

After that, when, for example, the power-off state of the processor has been ended and the core 12-1, tag area 12-2 and tag controller 12-4 of the CMOS circuit 12, and the cache data area 13-1 and tag area 13-2 of the nonvolatile memory 13 have been powered on again, as is shown in FIGS. 9 and 10, the tag controller 12-4 starts to copy tag data from the nonvolatile memory 13 to the CMOS circuit 12.

Further, the tag controller 12-4 continues to acquire tag data from the tag area 13-2 of the nonvolatile memory 13 until finishing copying of all tag data from the nonvolatile memory 13 to the CMOS circuit 12.

More specifically, the tag controller 12-4 acquires tag data after temporarily stopping copying of tag data, and resumes the copying of tag data after finishing tag data acquisition. This operation can be realized, for example, by providing, in the tag controller 12-4, a copy address register that stores the copying address of tag data.

The copy address register will be described later.

After finishing copying of all tag data from the nonvolatile memory 13 to the CMOS circuit 12, the tag controller 12-4 acquires tag data from the tag area 12-2 of the CMOS circuit 12.

Since in the embodiment, it is necessary to update the tag data in the two tag areas 12-2 and 13-2, an increased consumption of power is needed for updating tag data, compared to the case of updating only the tag data in the tag area 12-2 of the CMOS circuit 12.

However, it should be noted that updating of tag data is performed only when a miss determination has been made, and that in the cache system, most determinations are hit determinations and miss determinations little occur. Accordingly, the overhead (increases in power consumption) that will occur when the embodiment is employed is very small compared to the power consumption of the entire processor.

FIG. 11 shows a computing system incorporating the cache system of the embodiment.

The computing system comprises a main memory 10, and a processor (chip) 11. The main memory 10 is formed of, for example, a DRAM chip. Further, the processor 11 is formed of a chip with both the CMOS circuit 12 and the nonvolatile memory 13 mounted thereon.

The core 12-1 in the CMOS circuit 12 comprises L1 caches (e.g., SRAMs) 16 and computing units 17. Namely, the processor 11 of the embodiment is a multi-core processor wherein two computing units 17 are arranged in the core 12-1. The processor is not limited to the employment of one core, but may employ two or more cores. Further, the number of the computing units in the core is not limited to two, but may be only one, or three or more.

Since the tag area 12-2, the monitoring circuit 12-3 and the tag controller 12-4 have already been explained, they will not be described here.

A cache logic 12-5 performs a hit/miss determination. A power supply circuit 12-6 supplies a power supply voltage to the core 12-1, the tag area 12-2, the monitoring circuit 12-3, the tag controller 12-4 and the cache logic 12-5.

The nonvolatile memory 13 comprises the cache data area (L2 cache) 13-1, the tag area 13-2 and a power supply circuit 13-3. The power supply circuit 13-3 supplies a power supply voltage to the cache data area 13-1 and the tag area 13-2.

The core 12-1, the cache logic 12-5, the cache data area 13-1 and the main memory 10 are connected to each other via a data bus. Further, the core 12-1, the tag areas 12-2 and 13-3, the tag controller 12-4, the cache logic 12-5 and the main memory 10 are connected to each other via an address bus.

The monitoring circuit 12-3, the power supply circuits 12-6 and 13-3 and the tag controller 12-4 are connected to each other via a control signal line.

FIG. 12 shows the tag controller and the cache logic in detail.

The tag controller 12-4 comprises a tag flow controller 18, a state determination circuit 19 and a copy address register 20.

The tag flow controller 18 controls exchange of tag data (e.g., address information) between the tag area (volatile tag) 12-2, the tag area (nonvolatile tag) 13-2, the copy address register 20, the hit/miss determination circuit 21 and the main memory 10.

For instance, during the hit/miss determination, the tag flow controller 18 transfers tag data from one of the two tag areas 12-2 and 13-2 to the hit/miss determination circuit 21 in accordance with the state of the processor. Further, during copying of tag data, the tag flow controller 18 transfers tag data from the tag area 13-2 to the tag area 12-2.

Based on the output signal of the monitoring circuit 12-3, the state determination circuit 19 determines the state of the processor. For instance, the state determination circuit 19 determines whether the processor is in the normal operation state, or in the power off state, or in a recovery state (where tag data is being copied) from the power off state. The state determination circuit 19 can be formed of, for example, a register memory.

The copy address register 20 stores the address of copying of tag data from the tag area 13-2 to the tag area 12-2.

For example, if there is a request for processing data from the core 12-1 in a recovery state from the power interrupted state, before copying of all tag data is finished, the tag flow controller 18 interrupts copying of tag data, and transfers tag data from the tag area (nonvolatile tag) 13-2 to the hit/miss determination circuit 21.

Further, the tag flow controller 18 transfers, to the copy address register 20, the address of the tag data whose copying from the tag area 13-2 to the tag area 12-2 has been finished last. The copy address register 20 stores this address.

After transfer of tag data from the tag area (nonvolatile tag) 13-2 to the hit/miss determination circuit 21, the tag flow controller 18 resumes copying of tag data from the tag area 13-2 to the tag area 12-2, based on the address stored in the copy address register 20.

The cache logic 12-5 comprises the hit/miss determination circuit 21, a main memory data port 22 and an L2 cache data port 23.

The hit/miss determination circuit 21 determines, based on tag data, whether the data requested by the core 12-1 is stored in the cache data area (L2 cache) 13-1. If it is determined that the data requested by the core 12-1 exists in the cache data area 13-1, the data is transferred from the cache data area 13-1 to the core 12-1 via the L2 cache data port 23.

In contrast, if it is determined that the data requested by the core 12-1 does not exist in the cache data area 13-1, the data is transferred from the main memory 10 to the core 12-1 via the main memory data port 22.

The operation of the tag flow controller 18 will now be described.

Firstly, when a command to update tag data is issued as shown in FIG. 13, the tag data in the tag area (volatile tag)

12-2 and the tag data in the tag area (nonvolatile tag) 13-2 are updated. As a result, the two tag areas 12-2 and 13-2 store the same tag data.

Secondly, when a command to read tag data is issued in the normal operation as shown in FIG. 14, tag data is transferred from the tag area (volatile tag) 12-2 to the hit/miss determination circuit 21. This is performed because the reading of data from the volatile tag exhibits a less reading delay and a less power consumption than the data reading from the nonvolatile tag.

The hit/miss determination circuit 21 performs a hit/miss determination, based on tag data.

If a hit determination is made, processing data is transferred from the cache data area 13-1 to the core 12-1. In contrast, if a miss determination is made, processing data is transferred from the main memory 10 to the core 12-1, and is stored in the cache data area 13-1 for increasing the speed of access to the data in a subsequent occasion.

Figure 15:
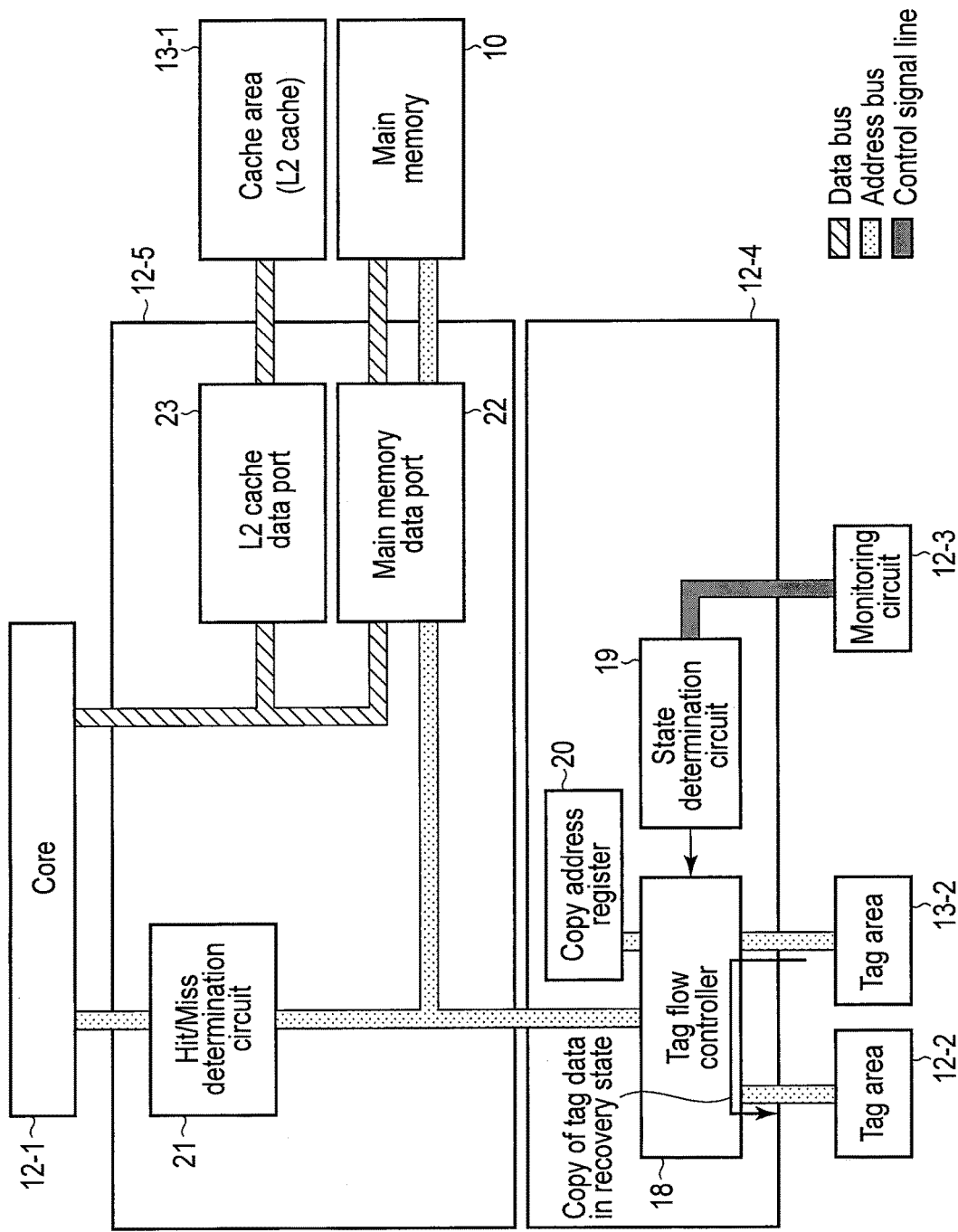

Thirdly, in the recovery state from the power off state, tag data is copied from the tag area (nonvolatile tag) 13-2 to the tag area (volatile tag) 12-2 as shown in FIG. 15. This is performed because the tag data in the volatile tag is erased when power is turned off.

Further, until copying of all tag data from the nonvolatile tag to the volatile tag is finished, the tag data in the nonvolatile tag is used. By using the tag data in the nonvolatile tag, data request by the core can be resumed immediately after the recovery of power.

However, in general, processing using the tag area (volatile tag) 12-2 can be performed less delay and lower power consumption than that using the tag area (nonvolatile tag) 13-2.

In light of this, when there is no tag data reading or updating command, tag flow controller 18 copies tag data from the tag area (nonvolatile tag) 13-2 to the tag area (volatile tag) 12-2 as shown in FIG. 15.

In contrast, when a tag data reading or updating command has been issued, the address of the tag data, copying of which from the nonvolatile tag to the volatile tag was finished last, is stored in the copy address register 20, and copying of tag data from the nonvolatile tag to the volatile tag is temporarily stopped as shown in FIG. 16.

After that, tag data is transferred from the tag area (nonvolatile tag) 13-2 to the hit/miss determination circuit 21 as shown in FIG. 17.

Furthermore, after tag data is read in response to the tag data reading command, copying of tag data from the nonvolatile tag to the volatile tag is resumed as shown in FIG. 18. At this time, copying is resumed from the address subsequent to the address stored in the copy address register 20.

The operation of the monitoring circuit will be described.

The monitoring circuit monitors the operation state of the processor, and sequentially shifts the processor to lower power consumption states after its idle state continues for a period greater than a predetermined time T. Reduction of power can be realized by, for example, reducing the power supply voltage or turning off the power to part of the circuits in the chip. The state of power consumption in the processor can be expressed by, for example, a C-state.

C0-state indicates the highest power consumption state of the processor. The power consumption of the processor is gradually reduced as the state is shifted in the order of C1-state, C2-state, . . . .

Figure 19:
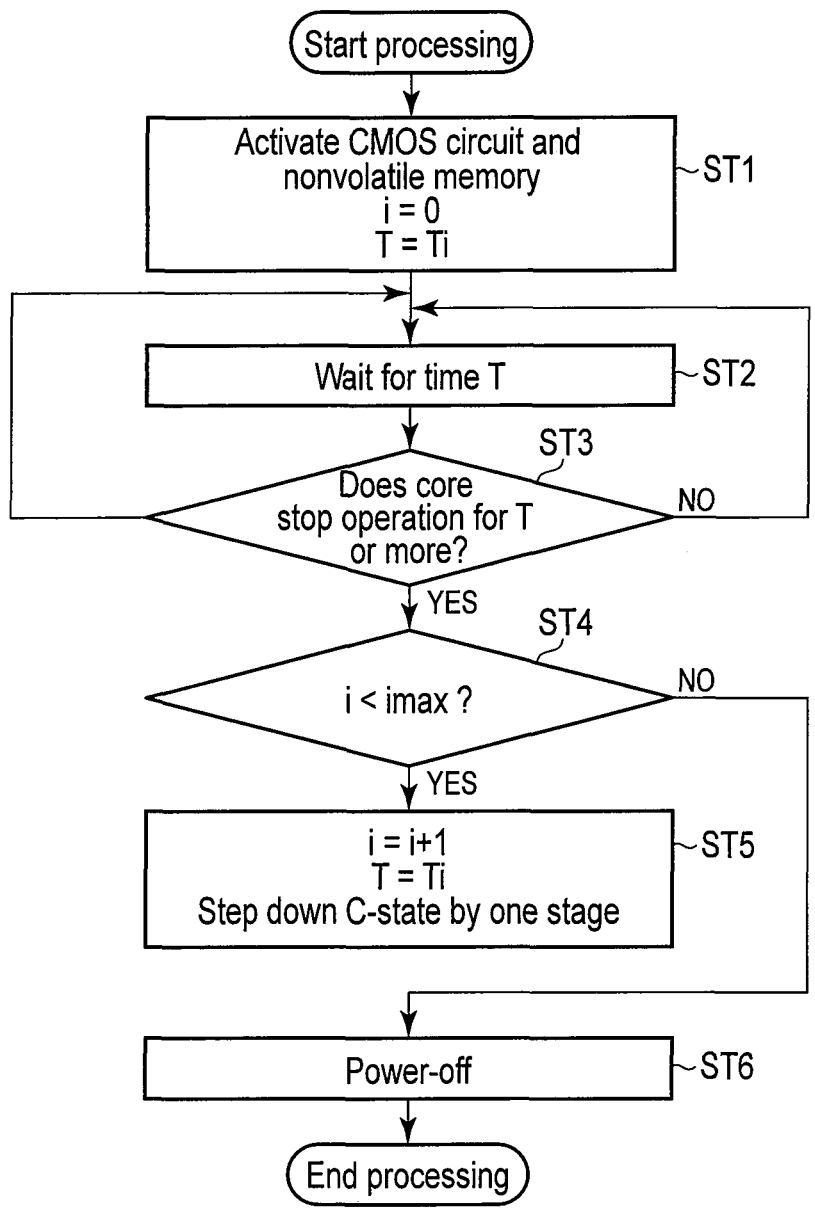
FIG. 19 is a flowchart showing the operation of a monitoring circuit.

FIG. 19 shows the operation of the monitoring circuit.

Firstly, when a data processing command has been issued to the processor, the power supplies for the CMOS circuit and the nonvolatile memory are activated. Further, the value i indicating the state of the processor is set to 0, and its waiting time T is set to Ti (step ST1).

Subsequently, the processor is set to wait for the time T (step ST2).

After that, it is determined whether the core is stopping its operation for the time T or more (step ST3). If it is determined that the core is not stopping its operation for the time T or more, the program returns to the step ST2, where the core is kept to stop until the stop time reaches the time T. In contrast, if it is determined that the core operation is stopping for the time T or more, it is determined whether the state i is less than a state imax (step ST4).

The state imax indicates a least power consumption state. For instance, it indicates a state in which the power to the processor is completely turned off (i.e., the power to the circuits other than the monitoring circuit is turned off).

If i≥imax, the power to the processor is completely turned off (step ST6).

If i<imax, i is set to i+1, and T is set to Ti, and the power consumption state (C-state) in the processor is stepped down by one stage. Namely, the power consumption state in the processor is shifted to a lower power consumption state (step ST5).

Thereafter, the program returns to step ST2.

As described above, the monitoring circuit sequentially steps down the processor to lower power consumption states while the processor is being kept in the idle state.

FIG. 20 shows the operation of each block in the cache system of FIG. 11.

A description will now be given of the operation of each block performed after a command to process data is issued to the processor until the processor is shifted to the C-state of the lowest power consumption, e.g., until the power to the cache system excluding the monitoring circuit is completely turned off.

Firstly, assume that the processor is in a completely power-off state. Also in this state, the monitoring circuit 12-1 is in the active state, i.e., it is continuing a power monitoring operation.

In this state, if a command to process data has been issued to the processor, power is supplied to the processor to make the core 12-1 start data processing. Namely, tag data is acquired from the tag area (nonvolatile tag) 13-2, and it is determined whether the data required by the core 12-1 exists in the L2 cache.

After power is supplied to the processor, copying of tag data from the tag area (nonvolatile tag) 13-2 to the tag area (volatile tag) 12-2 is started.

If a command to process data has been issued to the processor after copying of the tag data is finished, tag data is acquired from the tag area (volatile tag) 12-2, and it is determined whether the data required by the core 12-1 exists in the L2 cache.

Further, the tag data stored in the tag area (nonvolatile tag) 13-2 is updated when the tag data stored in the tag area (volatile tag) 12-2 is updated.

After data processing ends, the core 12-1, the tag areas 12-2 and 13-2 and the cache data area 13-2 are shifted in the idle state. The monitoring circuit 12-3 monitors the state of the processor, and sequentially steps down the same to the C-states if the processor is stopping its operation for the predetermined time T or more. Namely, the processor is sequentially shifted to the lower power consumption states.

FIGS. 21 to 24 show examples of the C-states.

In the example of FIG. 21, the C0-state is a state where power is supplied to all blocks of the processor, the C1-state is a state where power is supplied to the core and the monitoring circuit, and the C2-state is a state where power is supplied only to the monitoring circuit.

Namely, in the C1-state, the power to the nonvolatile memories (the nonvolatile tag and the cache data area), the cache logic and the volatile tag is turned off, while in the C2-state, the power to all blocks other than the monitoring circuit is turned off.

In the example of FIG. 22, the C0-state is a state where power is supplied to all blocks of the processor, the C1-state is a state where power is supplied to the core, the cache logic, the volatile tag and the monitoring circuit, the C2-state is a state where power is supplied to the core and the monitoring circuit, and the C3-state is a state where power is supplied only to the monitoring circuit.

Namely, in the C1-state, the power to the nonvolatile memories (the nonvolatile tag and the cache data area) is turned off, in the C2-state, the power to the nonvolatile memories, the cache logic and the volatile tag is turned off, and in the C3-state, the power to all blocks other than the monitoring circuit is turned off.

In the example of FIG. 23, the C0-state is a state where power is supplied to all blocks of the processor, the C1-state is a state where power is supplied to the cache logic, the volatile tag, the nonvolatile memories (the nonvolatile tag and the cache data area) and the monitoring circuit, and the C2-state is a state where power is supplied only to the monitoring circuit.

Namely, in the C1-state, the power to the core is turned off, while in the C2-state, the power to all blocks other than the monitoring circuit is turned off.

In the example of FIG. 24, the C0-state is a state where power is supplied to all blocks of the processor, the C1-state is a state where power is supplied to the cache logic, the volatile tag, the nonvolatile memories (the nonvolatile tag and the cache data area) and the monitoring circuit, the C2-state is a state where power is supplied to the monitoring circuit and the nonvolatile memories, and the C3-state is a state where power is supplied only to the monitoring circuit.

Namely, in the C1-state, the power to the core is turned off, in the C2-state, the power to the core, the cache logic and the volatile tag is turned off, and in the C3-state, the power to all blocks other than the monitoring circuit is turned off.

The recovery speed becomes faster as the number of the C-states is increased. In contrast, the power consumption becomes less as the number of the C-states is decreased.

For instance, the recovery from the C1-state of FIG. 22 can be achieved more quickly than that from the C1-state of FIG. 21. This is because the power off region in the C1-state of FIG. 22 is smaller than that in the C1-state of FIG. 21.

Further, the power consumption in the C1-state of FIG. 21 is smaller than that in the C1-state of FIG. 22. This is because the power off region in the C1-state of FIG. 21 is larger than that in the C1-state of FIG. 22.

Similarly, the recovery from the C2-state of FIG. 24 can be achieved more quickly than that from the C2-state of FIG. 23. This is because the power off region in the C2-state of FIG. 24 is smaller than that in the C2-state of FIG. 23.

Furthermore, the power consumption in the C2-state of FIG. 23 is smaller than that in the C2-state of FIG. 24. This is because the power off region in the C2-state of FIG. 23 is larger than that in the C2-state of FIG. 24.

If the waiting times (corresponding to Ti in FIG. 19) set in the C1-states of FIGS. 22 and 24 are shortened, the low power consumption effect in the C-states of FIGS. 22 and 24 can be made closer to that in the C-states of FIGS. 21 and 23.

It is desirable that the number of the C-states and the waiting time in each state be appropriately designed in accordance with the kind of operation executed by the processor.

Moreover, the order of power off of the blocks in the processor can be changed arbitrarily. In the C-states of FIGS. 21 and 22, the power to the core turned off after the power to the nonvolatile memories is turned off. In contrast, in the C-states of FIGS. 23 and 24, the power to the nonvolatile memories is turned off after the power to the core is turned off.

It is desirable to determine which one of these processes is appropriate, based on the recovery time (overhead) of the core and the recovery time (overhead) of the nonvolatile memories.

For instance, if the recovery time of the nonvolatile memories is shorter than that of the core, it is desirable to firstly turn off the power to the nonvolatile memories whose recovery time is shorter, as is shown in FIGS. 21 and 22. In contrast, if the recovery time of the core is shorter than that of the nonvolatile memories, it is desirable to firstly turn off the power to the core whose recovery time is shorter, as is shown in FIGS. 23 and 24.

In addition, in the embodiment, it is desirable to employ, as the nonvolatile memory, a next-generation memory, such as an MRAM, capable of performing high-speed operation, since the memory is used as a cache memory.

CONCLUSION

The embodiment can realize high-speed recovery from a power-off state, while simultaneously realizing low power consumption by power shutdown.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A processor comprising:
a core controlling processing data;
a first tag area storing tag data of cache data in a volatile manner;
a nonvolatile memory area having a cache data area and a second tag area, the cache data area being employed as a nonvolatile cache memory and storing the processing data as the cache data in a nonvolatile manner, the second tag area storing the tag data in a nonvolatile manner; and
a tag controller controlling the tag data,
wherein
the tag controller determines whether the processing data is stored in the cache data area by acquiring the tag data from one of the first and second tag areas,
the tag controller comprises a copy address register into which an address of the tag data, whose copying from the second tag area to the first tag area is finished, is stored when copying of the tag data from the second tag area to the first tag area is stopped, and copying of the tag data from the second tag area to the first tag area is resumed based on the address stored in the copy address register.

2. The processor of claim 1,
wherein the tag controller stores the tag data in the first and second tag areas when updating the tag data, and determines whether the processing data is stored in the cache data area based on the tag data in the first tag area, when executing a hit/miss determination of the processing data.

3. The processor of claim 2,
wherein the tag controller updates the tag data in the second tag area when updating the tag data in the first tag area.

4. The processor of claim 1, wherein
the core, the first and second tag areas, the tag controller and the cache data area are turned off, when an idle state of the processor has continued during a predetermined period, and
the tag controller copies the tag data stored in the second tag area to the first tag area, after the core, the first and second tag areas, the tag controller, and the cache data area are re-turned on.

5. The processor of claim 4,
wherein the tag controller acquires the tag data from the second tag area until completely copying the tag data stored in the second tag area to the first tag area, after the core, the first and second tag areas, the tag controller, and the cache data area are re-turned on.

6. The processor of claim 5,
wherein the tag controller acquires the tag data from the first tag area after completely copying the tag data stored in the second tag area to the first tag area.

7. The processor of claim 4, further comprising:
a monitoring circuit monitoring a power state of the processor,
wherein
the tag controller acquires the tag data from one of the first and second tag areas based on an output signal of the monitoring circuit, and
a power of the monitoring circuit is not turned off and remains turned on, after the core, the first and second tag areas, the tag controller, and the cache data area are turned off.

8. The processor of claim 4, wherein
tag controller acquires the tag data from the second tag area while interrupting copying of the tag data, before completely copying the tag data stored in the second tag area to the first tag area, and
the copy address register stores an address of the tag data finally copied from the second tag area to the first tag area.

9. The processor of claim 8,
wherein the tag controller resumes copying of the tag data from the second tag area to the first tag area based on the address, after acquiring the tag data from the second tag area.

10. The processor of claim 1, wherein
the core, the first tag area, and the tag controller are provided in a first chip, and
the nonvolatile memory area is provided in a second chip.

11. The processor of claim 10,
wherein the first and second chips are stacked on each other.

12. The processor of claim 1,
wherein the nonvolatile memory area includes an MRAM.

13. The processor of claim 1, wherein
the tag controller copies the tag data stored in the second tag area to the first tag area, after the first and second tag areas, the tag controller, and the cache data area are turned on, and
the tag controller determines whether the processing data is stored in the cache data area based on the tag data stored in the second tag area, until copying the tag data stored in the second tag area to the first tag area is finished.

* * * * *